(12) United States Patent
Su

(10) Patent No.: US 12,250,765 B2
(45) Date of Patent: Mar. 11, 2025

(54) ANTI-INTERFERENCE SURFACE MOUNT ELECTRONIC COMPONENT

(71) Applicant: Keng-Kuei Su, Kaohsiung (TW)

(72) Inventor: Zhou-Zong Su, Ganzhou (CN)

(73) Assignee: Kaotek Electronic Technology Co., Ltd., Kaohsiung (TW)

( * ) Notice: Subject to any disclaimer, the term of this patent is extended or adjusted under 35 U.S.C. 154(b) by 142 days.

(21) Appl. No.: 17/940,592

(22) Filed: Sep. 8, 2022

(65) Prior Publication Data

US 2023/0085011 A1 Mar. 16, 2023

(30) Foreign Application Priority Data

Sep. 13, 2021 (TW) .................................. 110134042

(51) Int. Cl.
*H05K 1/00* (2006.01)
*H05K 1/02* (2006.01)
*H05K 1/11* (2006.01)
*H05K 9/00* (2006.01)

(52) U.S. Cl.
CPC ............. *H05K 1/0216* (2013.01); *H05K 1/11* (2013.01); *H05K 9/0081* (2013.01)

(58) Field of Classification Search
CPC ....... H05K 1/0216; H05K 1/11; H05K 9/0081
See application file for complete search history.

(56) References Cited

U.S. PATENT DOCUMENTS

| 5,847,938 | A | * | 12/1998 | Gammon | ............... | H05K 9/003 |
| | | | | | | 361/752 |
| 9,513,675 | B2 | * | 12/2016 | Nicol | .................. | H05K 7/20127 |
| 11,744,057 | B1 | * | 8/2023 | Vaisman | ............... | H05K 9/0018 |
| | | | | | | 361/748 |
| 2003/0179055 | A1 | * | 9/2003 | Sweeney | ............... | H05K 1/0243 |
| | | | | | | 333/260 |
| 2019/0363055 | A1 | * | 11/2019 | Yazaki | ................ | H01L 23/3121 |

* cited by examiner

*Primary Examiner* — Pete T Lee
(74) *Attorney, Agent, or Firm* — Rosenberg, Klein & Lee

(57) ABSTRACT

An anti-interference surface mount electronic component includes a surface mount electronic component body having an outer side adapted to be grounded. An anti-interference layer unit is disposed on the outer side of the surface mount electronic component body. The outer side of the surface mount electronic component body includes two electrodes disposed in two symmetric directions extending along a planar surface. The two electrodes together define a separation area on the outer side of the surface mount electronic component body. The separation area includes a grounding end. The anti-interference layer unit includes a first anti-interference layer formed of an anti-interference coating. The first anti-interference layer is disposed around the separation area and an outer side of the grounding end and is spaced from each of the two electrodes. The first anti-interference layer includes an opening facing the grounding end.

3 Claims, 3 Drawing Sheets

ANTI-INTERFERENCE SURFACE MOUNT ELECTRONIC COMPONENT

BACKGROUND OF THE INVENTION

The present invention relates to an electronic component and, more particularly, to an anti-interference surface mount electronic component.

Parasitic oscillations may be coupled into adjacent circuits during signal amplification of an amplifying circuit or may emit electromagnetic waves during the amplification procedure, causing interference to ambient circuits. Particularly, in a case that the output resistance and the input resistance of an operational amplifier are closely arranged in parallel, positive feedback signals with parasitic oscillations are apt to occur. Particularly, due to continuous demand in miniaturization of current electronic products, a large amount of surface mount components, such as surface mount resistances, surface mount capacitors, etc., are used. In designing, these components disposed side by side tend to be too close to one another, which generates unnecessary signal coupling, resulting in parasitic oscillations.

Electromagnetic interference (EMI/EMC) in radio frequency circuits deserve high attention. When serious electromagnetic interference is generated after a circuit design is finalized into a product, the product subject to the electromagnetic interference cannot be used and cannot pass the inspection standard of telecommunication equipment in each country, either. In a conventional approach of prevention of electromagnetic interference (EMI/EMC), the transmitter or the receiver is covered by an iron box. However, the components in the iron box are without anti-interference treatment and, thus, interfere with each other. As a result, the transmitter emits unnecessary subharmonics, which interferences the use of frequency band, whereas the receiver is apt to generate radiated interference to local oscillation frequency.

Thus, the Applicant deems that every surface mount electronic component in the iron box should have an anti-interference function to avoid the above situations.

BRIEF SUMMARY OF THE INVENTION

In view of the shortcoming of the prior art, the Applicant provides a solution related to an anti-interference surface mount electronic component comprising a surface mount electronic component body having an outer side adapted to be grounded. An anti-interference layer unit is disposed on the outer side of the surface mount electronic component body. The outer side of the surface mount electronic component body includes two electrodes disposed in two symmetric directions extending along a planar surface. The two electrodes together define a separation area on the outer side of the surface mount electronic component body. The separation area includes a grounding end. The anti-interference layer unit includes a first anti-interference layer formed of an anti-interference coating. The first anti-interference layer is disposed around the separation area and an outer side of the grounding end and is spaced from each of the two electrodes. The first anti-interference layer includes an opening facing the grounding end.

According to the present invention, the anti-interference layer unit is disposed on the outer side of the surface mount electronic component body, such that the surface mount electronic component according to the present invention can prevent an audio circuit from parasitic oscillation. Furthermore, the electromagnetic waves generated during operation of the radio frequency circuit will not radiate outward to other electronic components while avoiding reception of undesired external electromagnetic wave interference signals. Thus, the present invention can overcome the shortcoming of the prior art anti-interference technology.

The present invention will become clearer in light of the following detailed description of illustrative embodiments of this invention described in connection with the drawings.

DETAILED DESCRIPTION OF THE INVENTION

Figure 1:
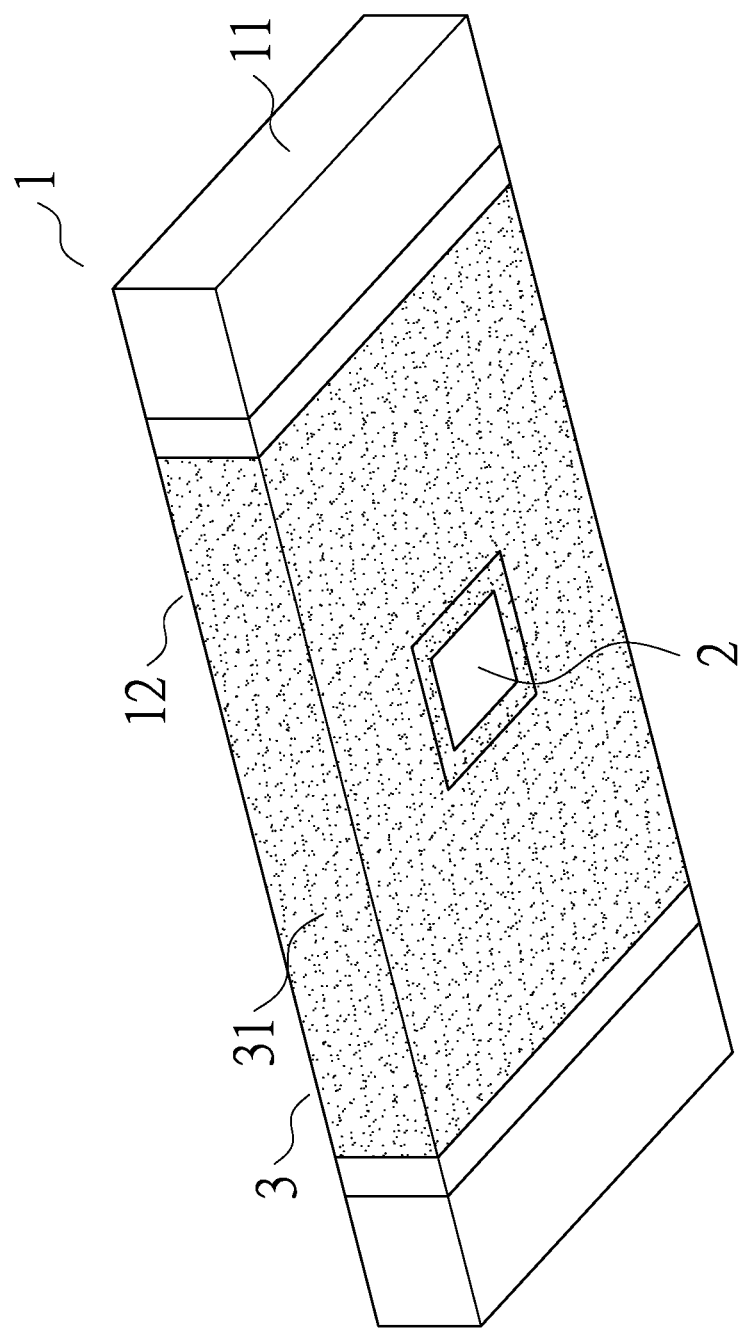
FIG. 1 is a perspective view of an anti-interference surface mount electronic component of a first embodiment according to the present invention.

With reference to FIG. 1, the present invention relates to an anti-interference surface mount electronic component comprising a surface mount electronic component body 1.

Figure 3:
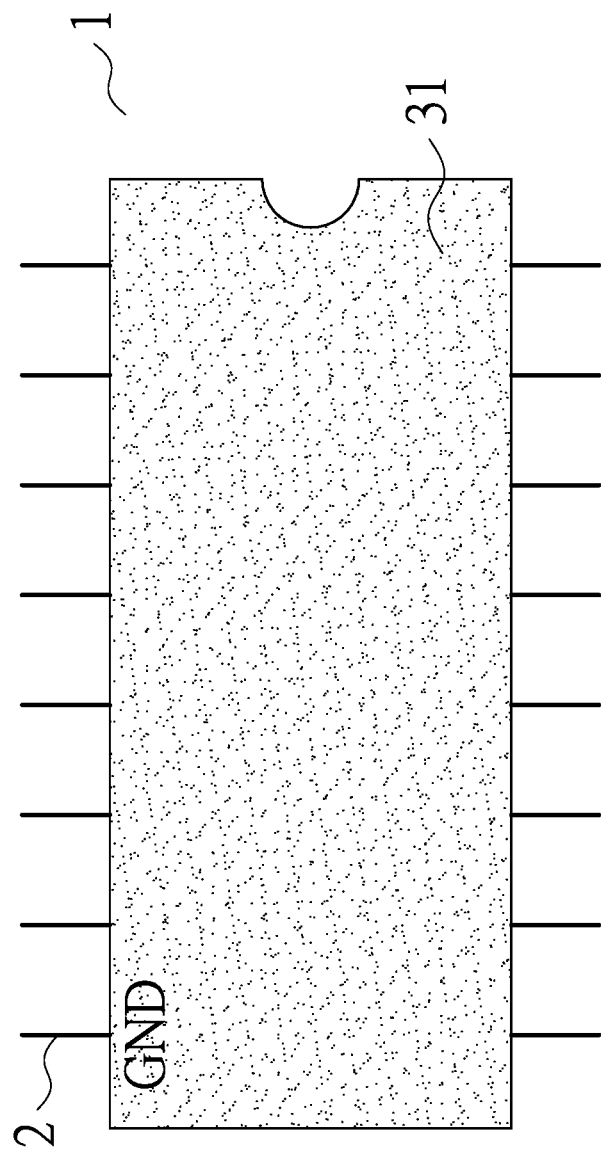
FIG. 3 is a diagrammatic view of an anti-interference surface mount electronic component of a third embodiment according to the present invention.

With reference to FIG. 3, the surface mount electronic component body 1 referred to in this specification includes a surface mount resistor, a surface mount transistor, a surface mount IC, etc. Namely, the surface mount electronic component body 1 referred to in this specification can be any surface mount electronic component. A grounding terminal 2 is disposed on an outer side of the surface mount electronic component body 1. Furthermore, an anti-interference layer unit 3 is disposed on the outer side of the surface mount electronic component body 1. In actual use of the present invention, the anti-interference layer unit 3 is preferably grounded to the outside.

An amplifier tends to incur positive feedback and generates parasitic oscillation when a surface mount resistor at the input end and a surface mount resistor at the output end are arranged in parallel. When the anti-interference surface mount electronic component according to the present invention is used, by the disposition of the anti-interference layer unit 3, the probability of occurrence of generation of the parasitic oscillation can be greatly reduced or even reduced to zero, overcoming the shortcoming of the prior art. Aside from mitigation of the above problem of the amplifier by the present invention, in the field of radio transmitter, the high-power signal emitted from the distal end is apt to interfere with a front-end component due to radiation, such that harmonic noise signals are mixed in the high-power signal and are also sent out. Nevertheless, by using the anti-interference surface mount electronic component according to the present invention, the interference between the front-end component and the rear-end component can be reduced or even eliminated, avoiding mixing of subharmonics in the emitted signals. Furthermore, to avoid a radio frequency receiver from unnecessary signal interference, the whole substrate of the receiver is covered by an iron box in the traditional technology. However, mutual interference can still occur between internal components, reducing the functionality of the receiver. Nevertheless, when the anti-interference surface mount electronic component according to the present invention is used on the part on the substrate, the interference from the outside can be reduced or even eliminated. Most importantly, the mutual interference between the internal electronic components can be avoided. Thus, there is no need to use an iron box to cover the outside of the radio frequency receiver.

Specific embodiments of the anti-interference layer 3 will be hereinafter described in connection with the drawings.

Firstly, with reference to FIG. 1, the outer side of the surface mount electronic component body 1 includes two electrodes 11 disposed in two symmetric directions extending along a planar surface. The two electrodes 11 together define a separation area 12 on the outer side of the surface mount electronic component body 1. The separation area 12 includes a grounding end 2. In this embodiment, the anti-interference layer unit 3 includes a first anti-interference layer 31 formed of an anti-interference coating. The first anti-interference layer 31 is disposed around the separation area 12 and an outer side of the grounding end 2 and is spaced from each of the two electrodes 12. The first anti-interference layer 31 includes an opening facing the grounding end 2. Furthermore, the grounding end 2 can be grounded to the outside via the opening. Other grounding measures include welding the opening, electrical connection, etc. to ground the grounding end 2. Nevertheless, any grounding measure for the grounding end 2 is still within the scope of protection of this specification. Similarly, the anti-interference layer referred to in this specification includes any measure providing an anti-interference effect. Furthermore, in actual use of this embodiment, the first anti-interference layer 31 is preferably grounded to the outside.

Figure 2:
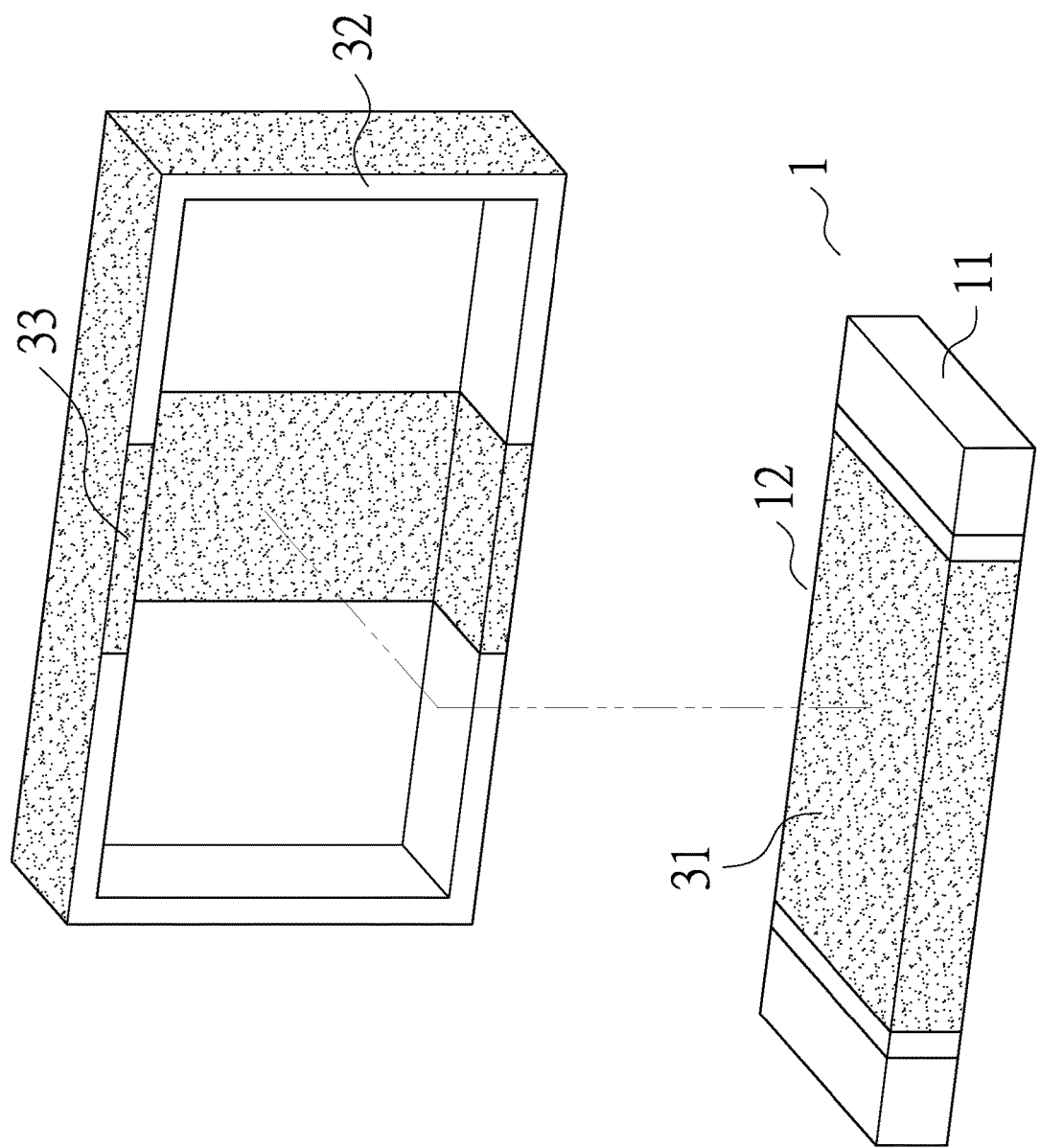
FIG. 2 is an exploded, perspective view of an anti-interference surface mount electronic component of a second embodiment according to the present invention.

Secondly, with reference to FIG. 2, this embodiment is based on the above, and the anti-interference layer unit 3 includes a casing 32 and a second anti-interference layer 33 formed of an anti-interference coating. The second anti-interference layer 33 is disposed on an outer side of the casing 32 and a portion of an inner side of the casing 32. A portion of the second anti-interference layer 33 on the outer side of the casing 32 is connected to another portion of the second anti-interference layer 33 on the inner side of the casing 32. The casing 32 includes an open bottom side and houses the outer side of the surface mount electronic component body 1 from top to bottom, such that the first anti-interference layer 31 is connected to the second anti-interference layer 33. Thus, the second anti-interference layer 33 is also grounded when the first anti-interference layer 31 is grounded, thereby further improving the overall anti-interference effect of the present invention. Furthermore, it is worth mentioning that each of the two electrodes 11 is spaced from the second anti-interference layer 33 to avoid electrical connection therebetween.

Thirdly, with reference to FIG. 3, in this embodiment, the surface mount electronic component body 1 is a surface mount IC. Since the surface mount IC has grounding pins serving as the grounding end 2, the first anti-interference layer 31 is disposed on the outer side of the surface mount electronic component body 1, as shown in this figure. It is worth mentioning that the grounding end 2 referred to in this specification is the grounding portion of the surface mount electronic component body 1, such that when the surface mount electronic component body 1 is in the form of a surface mount IC with grounding pins, the grounding pins are the grounding end 2 referred to in this specification. In a case that the outer side of the surface mount electronic component body 1 is grounded by welding, the welding portion is the grounding end referred to in this specification. Any mechanism achieving the grounding effect is the grounding end 2 referred to in this specification.

Furthermore, in the above three embodiments, the anti-interference layer unit 3 preferably further includes an anti-electromagnetic wave layer. The anti-electromagnetic wave coating is formed of an anti-electromagnetic wave coating which is coated on an outer surface of each of the first anti-interference layer 31 and the second anti-interference layer 33. Nevertheless, any mechanism achieving the anti-interference effect is the anti-interference layer 31, 33 referred to in this specification.

Although specific embodiments have been illustrated and described, numerous modifications and variations are still possible without departing from the scope of the invention. The scope of the invention is limited by the accompanying claims.

The invention claimed is:

1. An anti-interference surface mount electronic component comprising: a surface mount electronic component body having an outer side adapted to be grounded, wherein an anti-interference layer unit is disposed on the outer side of the surface mount electronic component body, wherein the outer side of the surface mount electronic component body includes two electrodes disposed in two symmetric directions extending along a planar surface, wherein the two electrodes together define a separation area on the outer side of the surface mount electronic component body, wherein the separation area includes a grounding end, wherein the anti-interference layer unit includes a first anti-interference layer formed of an anti-interference coating, wherein the first anti-interference layer is disposed around the separation area and an outer side of the grounding end and is spaced from each of the two electrodes, and wherein the first anti-interference layer includes an opening facing the grounding end, wherein the anti-interference layer unit includes a casing and a second anti-interference layer formed of an anti-interference coating, wherein the second anti-interference layer is disposed on an outer side of the casing and a portion of an inner side of the casing, wherein a portion of the second anti-interference layer on the outer side of the casing is connected to another portion of the second anti-interference layer on the inner side of the casing, wherein the casing includes an open bottom side and houses the outer side of the surface mount electronic component body from top to bottom, such that the first anti-interference layer is connected to the second anti-interference layer, and wherein each of the two electrodes is spaced from the second anti-interference layer.

2. The anti-interference surface mount electronic component as set forth in claim 1 wherein the anti-interference layer unit includes an anti-electromagnetic wave layer formed of an anti-electromagnetic wave coating, and wherein the anti-electromagnetic wave coating is disposed on an outer surface of each of the first anti-interference layer and the second anti-interference layer.

3. The anti-interference surface mount electronic component as set forth in claim 1, wherein the anti-interference layer unit includes an anti-electromagnetic wave layer formed of an anti-electromagnetic wave coating, and wherein the anti-electromagnetic wave coating is disposed on an outer surface of the first anti-interference layer.

\* \* \* \* \*